(12) United States Patent
Ansley et al.

(10) Patent No.: US 6,675,580 B2
(45) Date of Patent: *Jan. 13, 2004

(54) PV/THERMAL SOLAR POWER ASSEMBLY

(75) Inventors: Jeffrey H. Ansley, El Cerrito, CA (US); Jonathan D. Botkin, El Cerrito, CA (US); Thomas L. Dinwoodie, Piedmont, CA (US)

(73) Assignee: Powerlight Corporation, Berkeley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/966,387

(22) Filed: Sep. 28, 2001

(65) Prior Publication Data

US 2002/0046764 A1 Apr. 25, 2002

Related U.S. Application Data

(63) Continuation of application No. 09/606,657, filed on Jun. 28, 2000, now Pat. No. 6,295,818, and a continuation of application No. 09/443,964, filed on Nov. 19, 1999, now Pat. No. 6,525,361

(60) Provisional application No. 60/141,467, filed on Jun. 29, 1999.

(51) Int. Cl.$^7$ ................................................. F24J 2/36
(52) U.S. Cl. ....................... 60/641.8; 126/624; 257/431
(58) Field of Search ........................... 60/641.8, 641.11, 60/641.15; 125/624–626; 257/431; 438/48, 54, 69

(56) References Cited

U.S. PATENT DOCUMENTS 6,295,818 B1 * 10/2001 Ansley et al. ............. 60/641.8

* cited by examiner

Primary Examiner—Roy Potter
(74) Attorney, Agent, or Firm—James F. Hann; Haynes Beffel & Wolfeld LLP

(57) ABSTRACT

A flexible solar power assembly (2) includes a flexible photovoltaic device (16) attached to a flexible thermal solar collector (4). The solar power assembly can be rolled up for transport and then unrolled for installation on a surface, such as the roof (20, 25) or side wall of a building or other structure, by use of adhesive and/or other types of fasteners (23).

10 Claims, 6 Drawing Sheets

PV/THERMAL SOLAR POWER ASSEMBLY

This is a continuation of U.S. patent application Ser. No. 09/443,964 filed Nov. 19, 1999 now U.S. Pat. No. 6,525,361, which is a continuation of Ser. No. 09/606,657, filed Jun. 28, 2000, now U.S. Pat. No. 6,295,818, issued Oct. 2, 2001. Which claims benefit of Ser. No. 60/141,967 filed Jun. 29, 1999.

The U.S. Government has a paid-up license in this invention and the right in limited circumstances to require the patent owner to license others on reasonable terms as provided for by the terms of PVBonus Contract DF-FC36-97G010247 awarded by the Department of Energy.

BACKGROUND OF THE INVENTION

Solar thermal collectors have been made in the past in long extruded strips which are then installed by adhering to the surface of a building roof. Recent developments in the manufacturing of photovoltaic(PV) power cells using thin-film photovoltaic material deposited onto a thin sheet of metal or polymer has resulted in the ability to produce a flexible solar-electric power cell. This technique also allows the manufacturing of these power cells in continuous sheets.

SUMMARY OF THE INVENTION

The present invention is directed to the combination of a solar thermal collector and a photovoltaic device, each designed to capture energy in a different way, and to provide an assembly with better performance and economics than may result from the application of the two products separately.

The first aspect of the invention is directed to a solar power assembly comprising a flexible thermal solar collector and a PV device mounted to the thermal collector to create a solar power assembly. The assembly may have sufficient flexibility so it may be transported in a roll to a use site, unrolled and attached to a support at the use site. The thermal solar collector typically includes a plurality of fluid passageways.

Another aspect of the invention is directed to a hybrid solar power system including a solar power assembly, comprising a flexible thermal solar collector and PV device creating a flexible solar power assembly. An external heated fluid receiver, such as a heat exchanger, is fluidly coupled to the thermal solar collector. An external device, such as a regulated power supply, is electrically coupled to the PV device.

A further aspect of the invention is directed to a method for making a solar power assembly. A flexible thermal solar collector and a PV device are joined to create a flexible solar power assembly. The assembly is rolled for transport to a use site.

A still further aspect of the invention is directed to a method for installing a solar power assembly on a support at a use site comprising unrolling a solar power assembly from a roll, the solar power assembly comprising a flexible thermal collector and a PV device mounted to one another. The solar power assembly is attached to the support with the flexible thermal collector located between the support and the flexible PV device. The attaching step may be carried out using an adhesive and/or clips.

An additional aspect of the invention is directed to a solar power assembly comprising a polymer thermal solar collector and a PV device mounted thereto. The polymer may be a flexible polymer, such as EPDM.

Another aspect of the invention is directed to a solar power unit comprising a thermal solar collector and a PV device mounted thereto to create a solar power assembly. A collapsible glazing is mounted to the solar power assembly to overlie the PV device for movement between upright, inflated and collapsed, deflated conditions.

These various aspects of the invention provide a number of advantages. The invention permits the solar power assembly to be simply and securely mounted to a roof or other support by, for example, attaching the assembly directly to a roof membrane with an adhesive; this reduces or eliminates the need for additional mounting structure and also may eliminate the need for roof membrane-penetrating fasteners. Also, the assembly can take the place of the roof membrane by, for example, mounting strips of the solar power assembly adjacent to one another in a shingled fashion to form what is in essence a roof membrane. The manufacture of a PV device and thermal solar collector as one assembly may result in lower cost as well as simpler transportation and installation.

Other features and advantages of the invention will appear from the following description which the preferred embodiments have been set forth in detail in conjunction with the accompany drawings.

DESCRIPTION OF THE PREFERRED EMBODIMENTS

Figure 1:
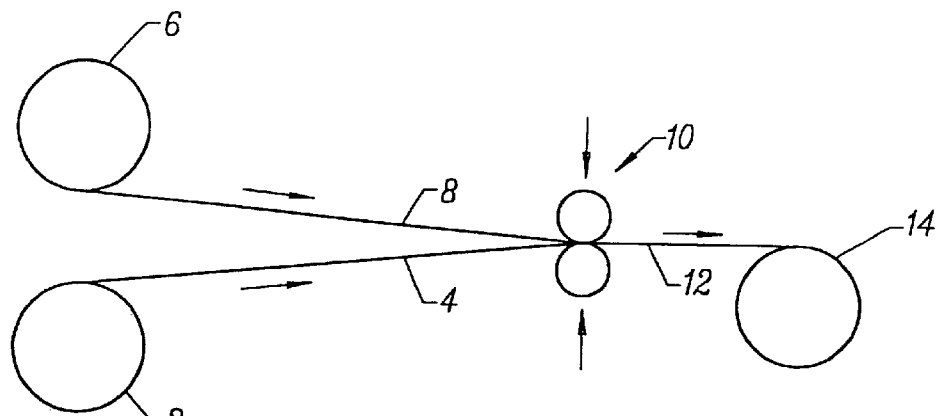
FIG. 1 is a schematic view illustrating joining of a length of a flexible thermal solar collector and a flexible PV device laminate to create a roll of a flexible solar power assembly.

FIG. 1 illustrates in schematic form a roll 2 of a flexible thermal solar collector 4 being joined to a roll 6 of a flexible photovoltaic (PV) device laminate 8, typically by the use of heat and/or adhesives and/or pressure at position 10, to create an elongate solar power assembly 12 which is wound into a roll 14.

Figure 2:
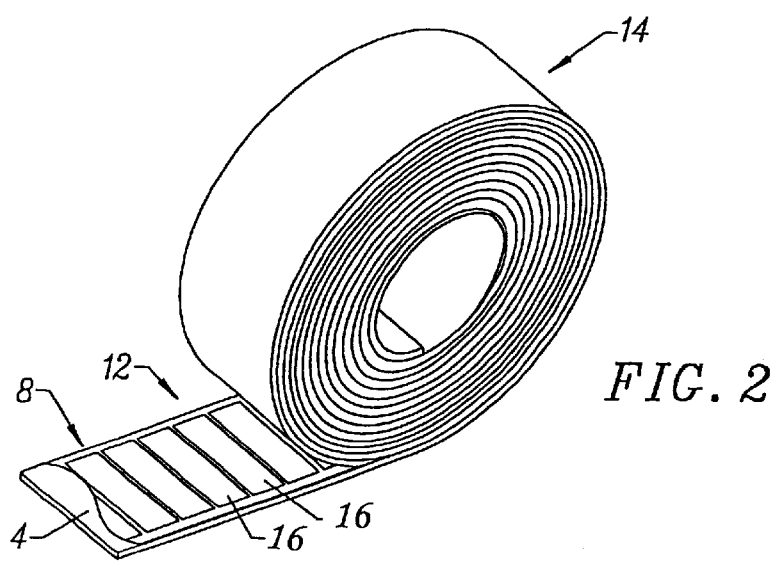
FIG. 2 is an enlarged view of the roll of the solar power assembly of FIG. 1 with a portion of the PV device laminate broken away to show the thermal solar collector.

FIG. 2 is an enlarged view of roll 14 and shows thermal solar collector 4 and PV device laminate 8 which are joined to form solar power assembly 12. Laminate 8 includes a series of PV devices 16 which are appropriately interconnected to obtain the desired electrical output during use.

Figure 3:
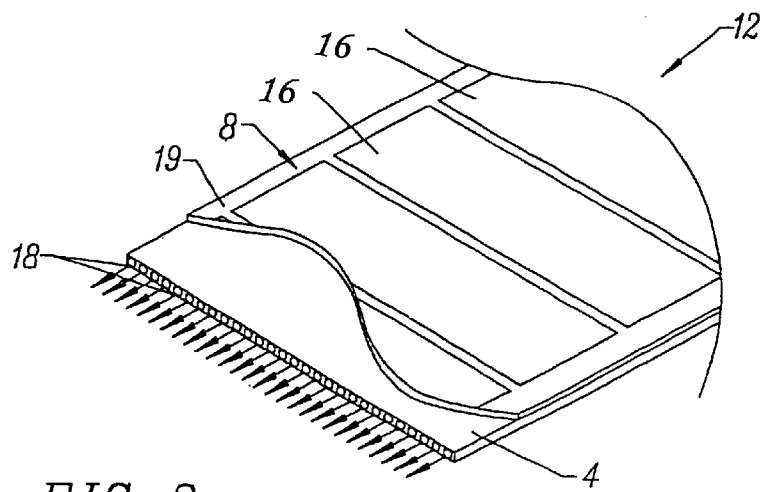
FIG. 3 is an enlarged view of the outer end of the flexible solar power assembly of FIG. 2 showing the series of fluid pathways formed in the thermal solar collector.

FIG. 3 illustrates a series of fluid passageways 18 formed through thermal solar collector 4. An appropriate fluid, such as water, is passed through passageways 18 to collect heat from solar collector 4. Fluid may be caused to flow through passageways 18 by natural convective flow, by pumping or by a combination thereof.

In the preferred embodiment of FIGS. 1–3, PV device laminate 8 comprises an amorphous silicon photovoltaic collector material deposited onto a stainless steel substrate 19, or other PV material, such as copper indium diselinide on substrate of similarly flexible material. While it is preferred that PV devices 16 be flexible, PV devices may be substantially rigid but shaped and sized so as not to impair the desired flexibility of collector 4.

Thermal solar collector 4 is made of a polymer, preferably of a flexible plastic or elastomer material such as polypropylene, PEX brand cross-linked polyethylene from Specialty Filaments, Inc. or Ethylene Propylene Diene Monomer (EPDM). Thermal solar collector 4 may be extruded in long sections. Making thermal solar collector 5 of a polymer has several advantages over conventional copper thermal solar collectors: lower cost; there is a better area match between the PV and thermal loads due to the less efficient thermal collection efficiency of polymers; the maximum design stagnation temperature for polymer solar thermal collectors is lower than for conventional copper solar thermal collectors so there is a better match with the maximum operating temperature of the PV device, typically about 80° C.; when the polymer is flexible, the solar power assembly may be flexible to permit the assembly to be stored and transported in rolls.

Solar power assembly 12 is preferably sufficiently flexible so that it may be wound into a roll having a minimum diameter of about 60 cm (2 foot), preferably about 30 cm (1 foot) and more preferably about 10 cm (4 inches). That is, power assembly 12 is flexible enough to permit it to be wound about a mandrel having a diameter of about 60 cm, preferably about 30 cm and more preferably about 10 cm.

Figure 4:
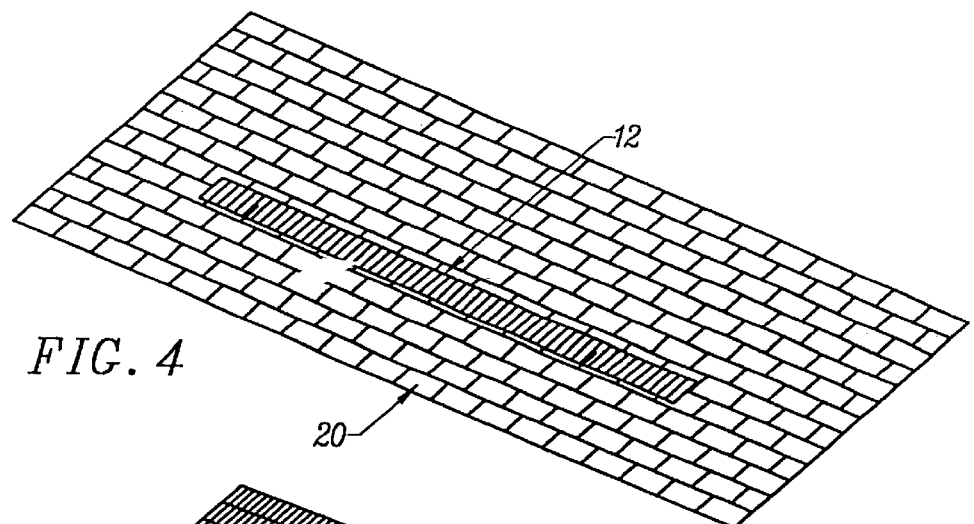
FIG. 4 illustrates a length of the solar power assembly of FIGS. 1–3 mounted to a shingled roof membrane of a building.
Figure 10A:
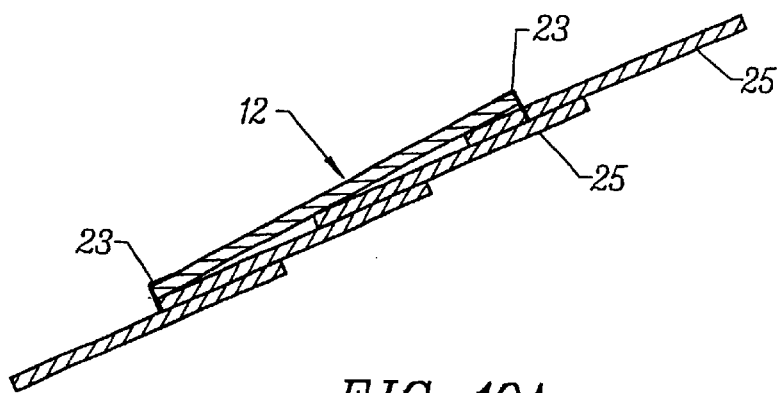
FIGS. 10A–B illustrate the use of clips for attaching a solar power assembly to supporting shingles.
Figure 10B:
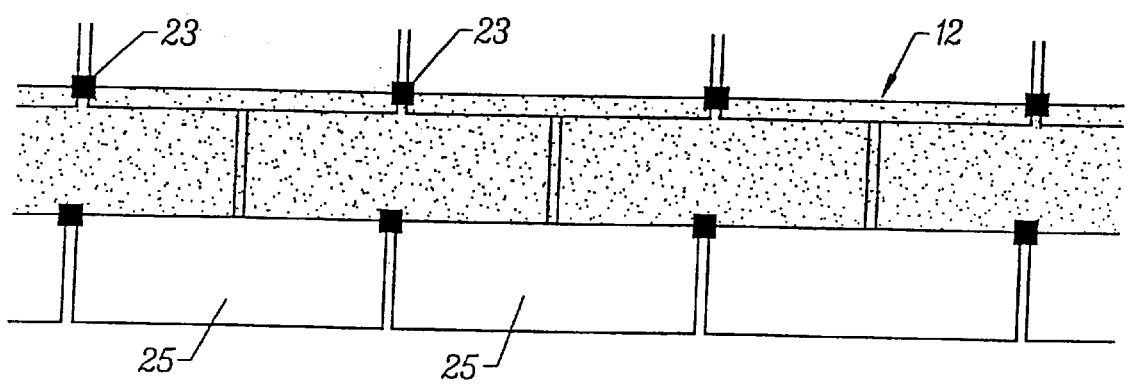

Assembly 12 may conveniently be transported to a work site as a roll 14. Once at the work site an appropriate length of assembly 12 may be removed from roll 14 and mounted to the support, such as roof membrane 20 shown in FIG. 4. While various hold-down structures and fasteners may be used to secure assembly 12 to roof membrane 20, solar power assembly 12 may often be mounted to a roof or other support simply by using an adhesive without the need for specialized mounting structures. Also, the solar power assembly may be formed into the desired lengths to appropriately fit a desired location. The invention facilitates not only the manufacturing of hybrid solar power assembly 12, it also facilitates transport and installation of the solar power assembly. When adhesives are used, the adhesives may supply all, or at least a majority of, the hold-down strength holding assembly 12 to the support. In an alternate embodiment, see FIGS. 10A and 10B, clips 23 may be used to secure assembly 12 to shingles 25 to supply all, substantially all, or at least a majority of, the hold-down strength to the roof.

Figure 5:
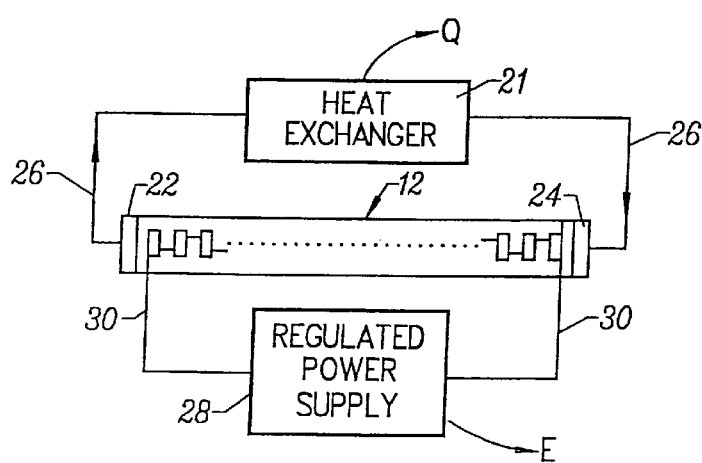
FIG. 5 is a schematic representation illustrating the fluid and electrical connections to the solar power assembly of FIG. 4.

FIG. 5 illustrates schematically one way in which assembly 12 may be connected for use. FIG. 5 illustrates a heat exchanger 21 connected to opposite ends 22, 24 of assembly 12 by a conduit 26. Ends 22, 24 are typically in the form of manifolds to combine and distribute the fluid flow, typically a water-based liquid, from and to fluid passageways 18. The output from PV devices 16 is provided to a regulated power supply 28, which typically may include appropriate control electronics, storage batteries, an inverter, etc, by an electrical line 30. In lieu of heat exchanger 21, heated water, or other liquid, could be used directly; for example, pre-heated water could be supplied from end 26 of assembly 12 to a water heater with replacement water being directed to the end 24 of assembly 12 from, for example, a municipal water supply, or water could be supplied from end 26 directly into a fluid reservoir, such as a swimming pool. Also, regulated power supply 28 could be replaced, for example, by control electronics which would provide alternating current to a user's dwelling and/or to a commercial electric power grid. Other uses of heated fluid and electricity can also be made.

Figure 6:
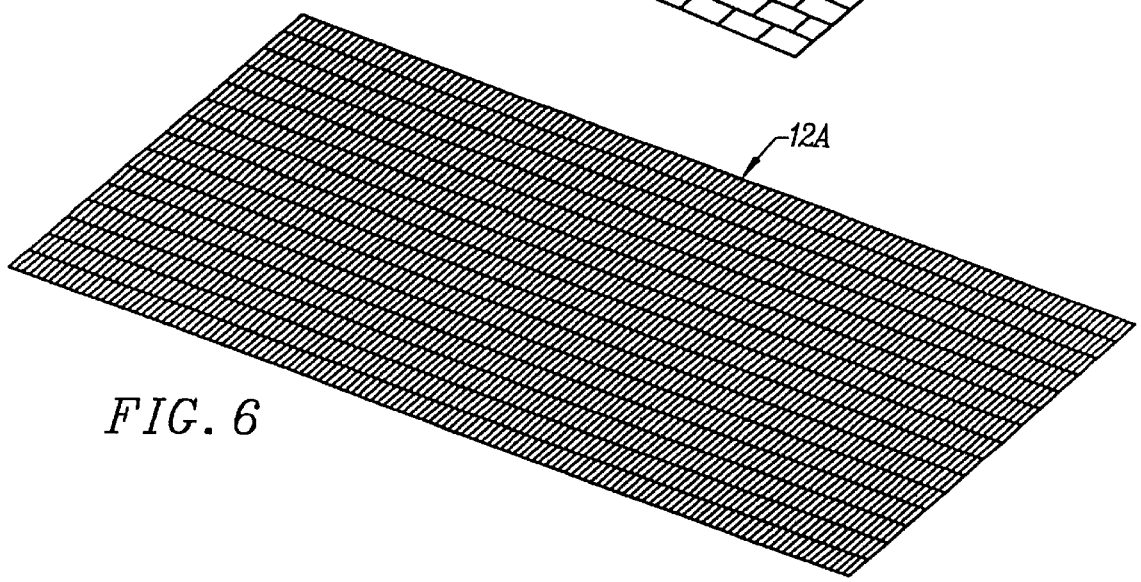
FIG. 6 illustrates a roof membrane created by a shingled series of adjacent lengths of the power assembly of FIGS. 1–5.

FIG. 6 illustrates a solar power assembly 12A in a form of numerous strips of solar power assemblies 12 joined at their adjacent edges, typically in a shingled or other rain-shedding configuration. Alternatively, solar power assembly 12A could be manufactured as a unitary piece. Solar power assembly 12A itself could act as a roof-membrane itself. This can result in increasing the life of a roof membrane or it may enable one to forego the use of a separate roof membrane altogether. Solar power assemblies could also be made to act as side wall cladding for buildings. Roof membranes and side wall cladding are layers which protect the structures from the effects of the environment, primarily rain, and will be referred to generally as weather barriers.

Figure 7A:
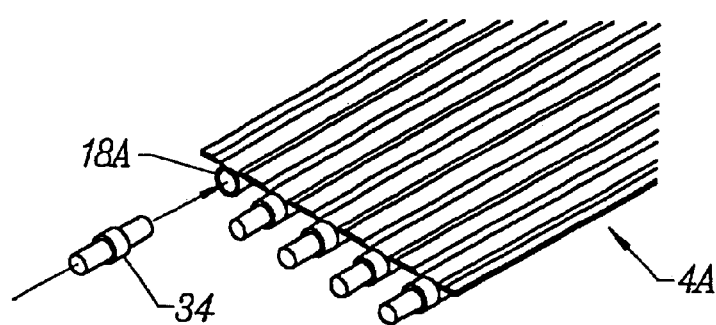
FIGS. 7A–7C illustrate an alternative embodiment of the invention in which adjacent thermal solar collectors can be joined using fluid couplers between aligned fluid passageways and a clip to secure the joint.
Figure 7B:
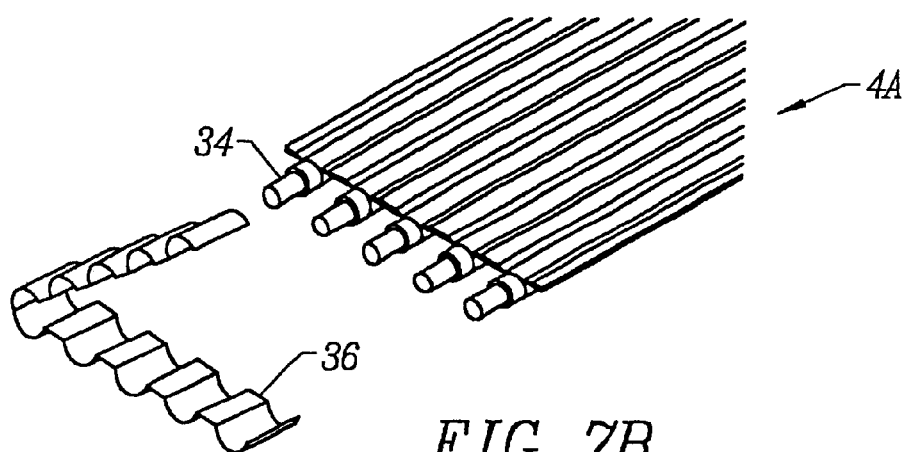
Figure 7C:
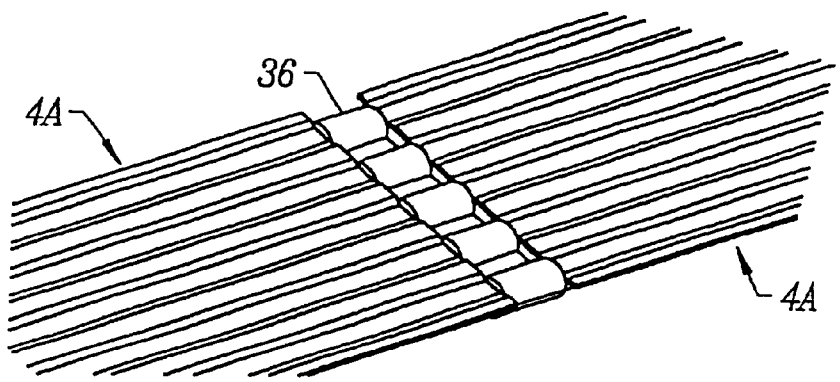

FIGS. 7A–7C illustrate an alternative embodiment of the thermal solar collector 4 of FIGS. 1–3. Thermal solar collector 4A is shown to include fluid passageways 18A sized to accept fluid couplers 34. Adjacent ends of two thermal solar collectors 4A can be joined using fluid couplers 34; the joint created can be secured through the use of a clip 36 as shown in FIGS. 7B and 7C. Such a joint may also be secured using additional fasteners and/or adhesives.

Figure 8A:
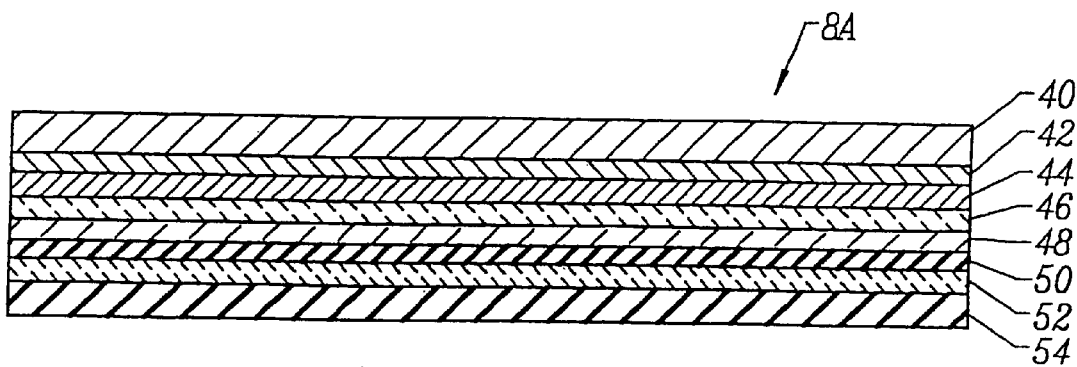
FIGS. 8A–8C illustrate enlarged cross-sectional views of three embodiments of the PV device laminate of FIGS. 1–3.

FIG. 8A is an enlarged cross-sectional view of one embodiment of a PV device laminate 8A made in accordance of the invention. Laminate 8A comprises a top layer 40, typically of glass or a halogenated hydrocarbon film such as Tefzel, from DuPont, or other suitable material. A typical thickness for top layer 40 is on the order of 50 microns for material such as Tefzel while a typical thickness for encapsulant layer 42 is on the order of 0.76 mm (0.03 inch) for a material such as Ethyl Vinyl Acetate (EVA). Next comes an encapsulant layer 42 typically made of EVA film. Third is the PV active layer 44. Below PV layer 44 is a PV substrate 46, typically made of stainless steel, aluminum, a polymer or some other suitable material. Next comes a second encapsulant layer 48, which may or may not be made of the same material as encapsulant layer 42. Beneath encapsulant layer 48 is a backskin 50, made of a material such as Tedlar brand polyvinyl fluoride film from DuPont, Tefzel from DuPont, or aluminum foil. Beneath backskin 50 is a third encapsulant layer 52. The bottom layer is a thermal collector material layer 54. Encapsulant layers 42, 48 and 52 may also be characterized as adhesive layers. Adhesion between the various layers may be accomplished using thermoplastic sheets, such as EVA, polyethylene or other suitable material. The bonding process will typically use a lamination technique or direct adhesive application or both. PV device laminate 8A illustrates a typical layering sequence. PV device laminate 8A may also be made by adding or subtracting various layers; for example, thermal collector material layer 54 may constitute thermal solar collector 4, thus eliminating the need for encapsulant layer 52 and backskin 50.

Figure 8B:
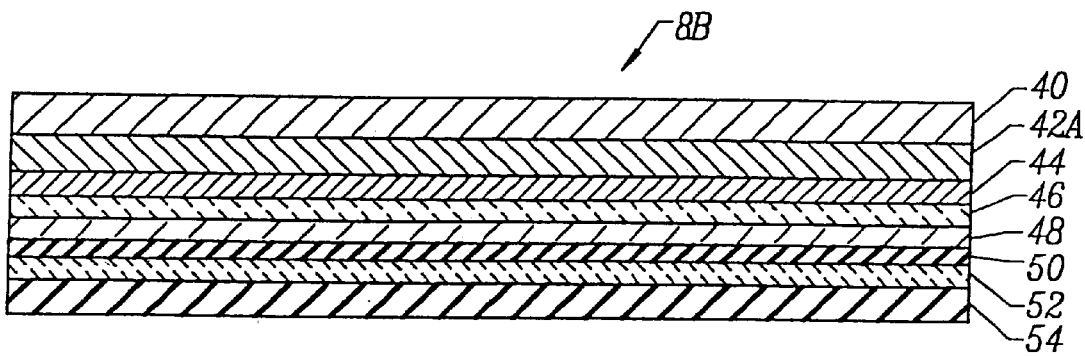

FIG. 8B illustrates a PV device laminate 8B which is substantially identical to laminate 8A with the exception of encapsulant layer 42B. The thickness of encapsulant layer 42B is increased to increase the thermal insulation above PV active layer 44. Doing so allows the solar power assembly to operate at increased temperatures, thus increasing the heat flow to a fluid in the thermal solar collector. To increase the thermal insulation above PV active layer 44, the thickness of encapsulant layer 42B may be increased from, for example, about 0.76 mm to as much as 6.4 mm (0.25 inch) causing encapsulant layer 42B to serve as both an encapsulant and a thermal barrier. The increased thermal insulation may also be achieved by or aided by increasing the thickness of top layer 40. Increasing the thickness of layer 42, when made of a material such as EVA, reduces thermal losses by an amount greater than an equivalent thickness of air (see FIG. 8C) due to the lower thermal conductivity of EVA and the lack of convective currents in the EVA. Further, direct contact of encapsulant layer 42B with top layer 40 and PV active layer 44 reduces incident light losses compared with an equivalent air gap.

Figure 8C:
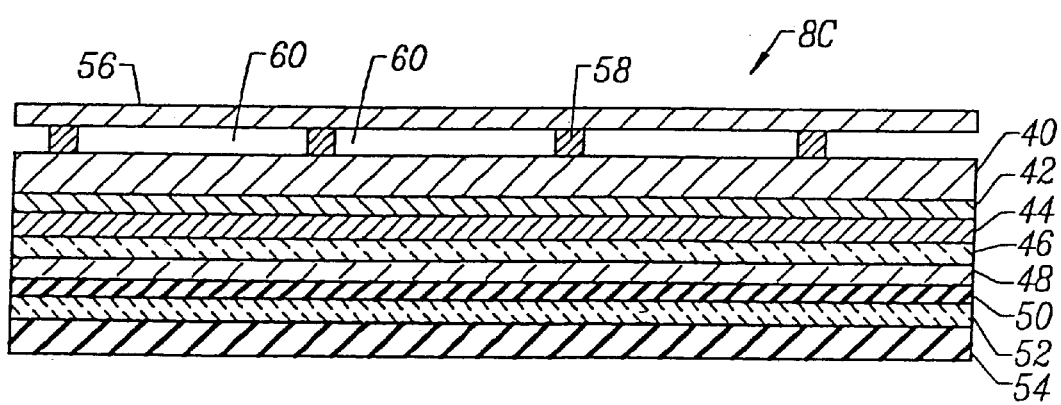

FIG. 8C illustrates an alternative embodiment of the PV device laminate 8A of FIG. 8A. Laminate 8C is similar to laminate 8A but includes an oversheet 56 mounted to above top layer 40 by spacer 58 to create void spaces 60 therebetween. Oversheet 60 may be of the same material as top layer 40 or a different material suitable for placement above PV active layer 44.

Figure 9A:
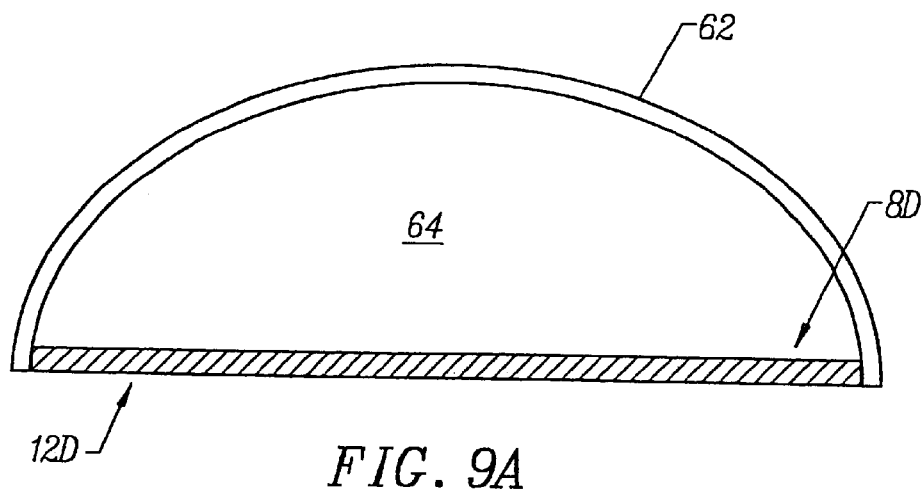
FIGS. 9A–B illustrate an alternative embodiment of the invention in which an inflatable cover material is used above the photovoltaic device laminate.
Figure 9B:
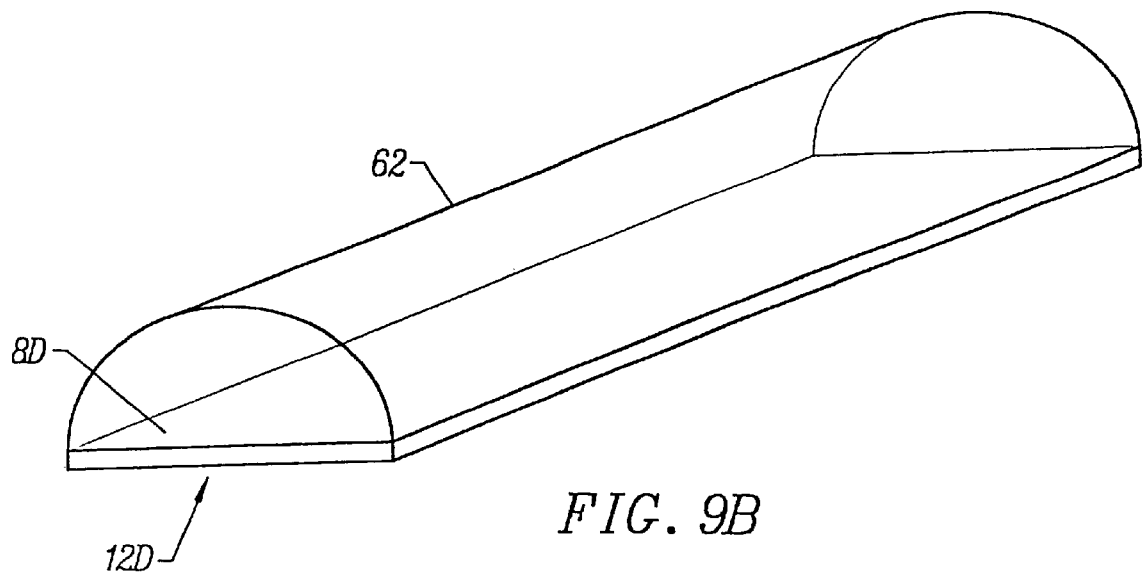

FIGS. 9A–B illustrate, in simplified schematic form, use of a collapsible glazing 62 above a PV device laminate 8D of assembly 12D. Collapsible glazing 62 is supported in its expanded, raised condition by the dynamic pressure drop of a circulating operating fluid passing through thermal solar collector, the operating fluid being air, water, or some other fluid. Collapsible glazing 62 inflates during thermal collection and falls slack or collapses during the generation of electricity only. Glazing 62 offers good thermal insulation during thermal collection, and reduced stagnation temperatures during electric only operation because the insulating layer between collapsible glazing 62 and PV device laminate 8D is greatly reduced when the circulating pump or fan is turned off.

Collapsible glazing 62 is preferably inflated by blowing air into the region 64 between glazing 62 and assembly 12D. A fluid, such as air or water, may be forced through passageways formed in assembly 12D (such as with a fan, a pump or by convective forces); however, the passage of a fluid through region 64 may be sufficiently efficient at removing heat so to eliminate the need for passage of a fluid through passageways in assembly 12D. Glazing 62 could, for example, incorporate hollow ribs which could be filled with a fluid to cause the glazing to assume its expanded, raised condition shown in FIGS. 9A–B.

Modifications and variations can be made to the disclosed embodiments without departing from the subject of the invention as defined in the following claims. For example, PV devices 16 could be mounted directly to thermal solar collector 4.

Any and all patents, patent applications and printed publications referred to above are incorporated by reference.

What is claimed is:

1. A solar power assembly comprising:
   a flexible thermal solar collector; and
   a photovoltaic (PV) device mounted to the thermal solar collector to create a solar power assembly.

2. The assembly according to claim 1 wherein the solar power assembly has sufficient flexibility to be transported in a roll to a use site, unrolled and attached to a support at the use site.

3. The assembly according to claim 1 wherein the thermal solar collector comprises a plurality of fluid passageways.

4. The assembly according to claim 3 wherein the fluid passageways have open ends, and further comprising fluid couplers mountable to the open ends of the fluid passageways so to permit said fluid passageways of plurality of said thermal solar collectors to be fluidly connected to one another.

5. The assembly according to claim 1 further comprising:
   a unitary thermal solar collector; and
   a plurality of said PV devices, said PV devices being interconnected with one another and mounted to the unitary thermal solar collector.

6. The assembly according to claim 1 wherein the solar power assembly is sufficiently flexible to be transported in a roll having a minimum diameter of about 60 cm or smaller.

7. The assembly according to claim 1 further comprising a flexible PV device laminate, joined to the flexible thermal solar collector, comprising a flexible substrate carrying a plurality of said PV devices.

8. The assembly according to claim 1 where said PV device is flexible.

9. The assembly according to claim 1 further comprising a collapsible glazing mounted above the PV device for movement between an upright, inflated condition and a collapsed, deflated condition.

10. A solar power assembly comprising:
    a flexible thermal solar collector comprising a plurality of fluid passageways;
    a flexible photovoltaic (PV) device laminate, mounted to the thermal solar collector to create a solar power assembly having sufficient flexibility to be transported in a roll to a use site, unrolled and attached to a support at the use site;
    the flexible PV device laminate comprising a flexible substrate carrying a plurality of interconnected PV devices;
    the solar power assembly being sufficiently flexible to be transported in a roll having a minimum diameter of about 60 cm or smaller.

* * * * *

UNITED STATES PATENT AND TRADEMARK OFFICE
CERTIFICATE OF CORRECTION

PATENT NO. : 6,675,580 B2
DATED : January 13, 2004
INVENTOR(S) : Ansley et al.

It is certified that error appears in the above-identified patent and that said Letters Patent is hereby corrected as shown below:

<u>Title page,</u>
Item [63], Related U.S. Application Data, should be corrected as follows:
-- Continuation of application No. 09/606,657, filed on Jun. 28, 2000, now Pat. No. 6,295,818. --

Signed and Sealed this

Twenty-second Day of March, 2005

JON W. DUDAS
*Director of the United States Patent and Trademark Office*